United States Patent [19]

Matsui et al.

[11] Patent Number: 4,901,328

[45] Date of Patent: Feb. 13, 1990

[54] SEMICONDUCTOR VSIS LASER

[75] Inventors: Sadayoshi Matsui, Tenri; Haruhisa Takiguchi, Osaka; Shinji Kaneiwa, Tenri; Mototaka Taneya, Sakai, all of Japan

[73] Assignee: Sharp Kabushiki Kaisha, Osaka, Japan

[21] Appl. No.: 380,745

[22] Filed: Jul. 17, 1989

Related U.S. Application Data

[63] Continuation of Ser. No. 188,765, May 3, 1988, abandoned, which is a continuation of Ser. No. 54,041, May 26, 1987, abandoned, which is a continuation of Ser. No. 662,687, Oct. 19, 1984, abandoned.

[30] Foreign Application Priority Data

Oct. 25, 1983 [JP] Japan .................................. 58-200261

[51] Int. Cl.$^4$ .............................................. H01S 3/19
[52] U.S. Cl. ..................................... 372/46; 372/45; 372/48; 372/49
[58] Field of Search ....................... 372/44, 45, 46, 48, 372/49

[56] References Cited

PUBLICATIONS

Yamamoto et al., "Visible GaAlAs V—Channeled Substrate Inner Stripe Laser with Stabilized Mode Using p—GaAs Substrate," Appl. Phys. Let. 40(5), Mar. 1, 1982, pp. 372–374.

Chen et al., "Narrow Double—Current—Confinement Channeled—Substrate Planar Laser Fabricated by Double Etching Technique", Appl. Phys. Let. 36(8), Apr. 15, 1980, pp. 634–636.

Primary Examiner—John D. Lee
Assistant Examiner—Georgia Y. Epps
Attorney, Agent, or Firm—Birch, Stewart, Kolasch & Birch

[57] ABSTRACT

A V-channeled substrate inner strip (VSIS) semiconductor laser includes a p-$Ga_{1-31\ y}Al_yAs$ active layer sandwiched between a P-$Ga_{1-x}Al_xAs$ first cladding layer and an n-$Ga_{1-x}Al_xAs$ second cladding layer. The AlAs mole fraction x of the first and second cladding layers is selected between about 0.45 and 0.52 in order to minimize the mode competition noise at an operating temperature. In a preferred form, the cavity length is longer than 300 $\mu$m so as to minimize the occurrence of the mode competition noise at the operating temperature. Furthermore, the reflectivity $R_1$ of the front facet and the reflectivity $R_2$ of the rear facet are selected to satisfy the condition $0.1 \leq \ln(1/R_1 \cdot R_2) \leq 1$.

3 Claims, 3 Drawing Sheets

SEMICONDUCTOR VSIS LASER

This application is a continuation of application Ser. No. 07/188,765 filed on May 3, 1988, which is a continuation of application Ser. No. 054,041 filed on May 20, 1987, which is a continuation of application Ser. No. 662,687 filed on Oct. 19, 1984, all of which are abandoned.

BACKGROUND OF THE INVENTION

1. Field of the Invention

The present invention relates to a semiconductor laser and, more particularly, to a semiconductor laser structure which minimizes mode competition noise derived from unstable longitudinal mode transition caused by temperature variations.

2. Description of the Prior Art

A semiconductor laser oscillating at the single longitudinal mode is widely used as a light source in an optical information processing system such as an information recording/drawing disc system. However, in the semiconductor laser of the above-mentioned type, unstable longitudinal mode transition occurs and mode competition noise is generated when the ambient temperature rises. The thus produced mode competition noise will preclude an accurate operation of the optical information processing system.

OBJECTS AND SUMMARY OF THE INVENTION

Objects of the Invention

Accordingly, an object of the present invention is to provide a semiconductor laser which ensures a stable operation even when the ambient temperature is considerably high.

Another object of the present invention is to provide a V-channeled substrate inner stripe (VSIS) semiconductor laser which minimizes the occurrence of the mode competition noise caused by the unstable longitudinal mode transition.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, in an index guided semiconductor laser having the inner stripe structure, the mole fraction of a cladding layer and the cavity length are selected at preferable values so that the mode competition noise occurs at a temperature higher than the normal operating temperature. The mode competition noise is minimized, whereby the semiconductor laser of the present invention is suited for a light source in an optical information processing system.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
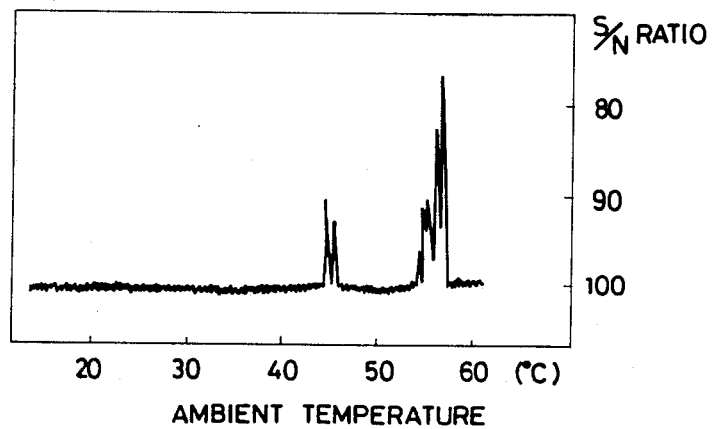
FIG. 1 is a graph showing the S/N ratio of the laser beam emitted from a typical semiconductor laser, the S/N ratio varying depending on the ambient temperature.

FIG. 1 shows the S/N ratio of the laser output varying depending on the ambient temperature. The mode competition noise occurs when the lasing longitudinal mode goes and returns between a plurality of longitudinal modes. Generally, the mode competition noise occurs when the semiconductor laser is operated at a considerably high temperature. In FIG. 1, the mode competition noise occurs when the ambient temperature rises above 45° C. When the mode competition noise occurs, the S/N ratio of the laser output (center frequency 8 MHz with 10 KHz bandwidth) reduces to 70 through 80 dB. Accordingly, the laser beam having the mode competition noise is not suited for the light source in an optical information processing system.

An index guided semiconductor laser generally oscillates in a single longitudinal mode at room temperature. However, the mode competition noise occurs as the ambient temperature rises. An index guided semiconductor laser having the inner stripe structure, such as a V-channeled substrate inner stripe (VSIS) semiconductor laser wherein an optical wave guide and a current confinement structure are formed at the same time, shows a stable operation as compared with the index guided semiconductor laser of the planer structure. The index guided semiconductor laser having the inner stripe generally includes a current blocking layer formed on a substrate. A V-shaped groove is formed in the current blocking layer, which operates as a current path. A multi layered crystal is formed on the current blocking layer. The index guided semiconductor laser having the inner stripe structure ensures a stable operation because the transverse optical intensity distribution in the optical waveguide and the carrier distribution in the active layer caused by the injection current coincide with each other. Furthermore, more, the index guided semiconductor laser having the inner stripe structure does not produce the mode competition noise even at a considerably high temperature, for example, 40° C. through 50° C. However, when the semiconductor laser is installed in an optical information processing system, the ambient temperature becomes about 50° C. through 60° C. Thus, there is a great possibility that the mode competition noise occurs when the normal index guided semiconductor laser having the inner stripe structure is used as the light source in the optical information processing system.

Figure 2:
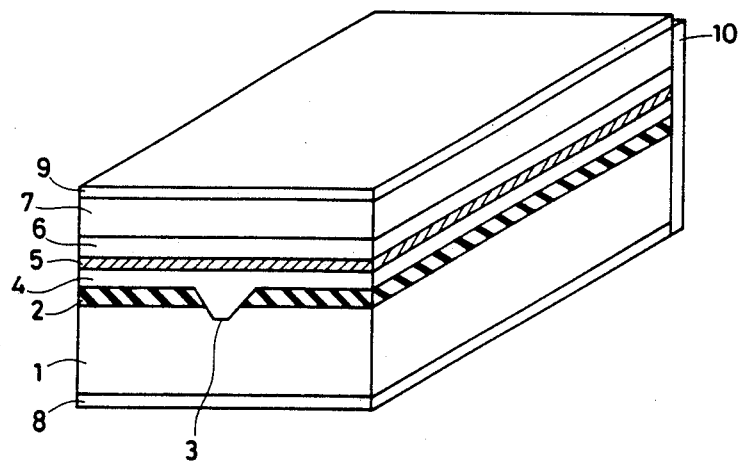
FIG. 2 is a perspective view of an embodiment of a V-channeled substrate inner stripe (VSIS) semiconductor laser of the present invention.

FIG. 2 shows an embodiment of a GaAs-GaAlAs V-channeled substrate inner stripe (VSIS) semiconductor laser of the present invention. A Te doped n-GaAs current blocking layer 2 having the carrier density of $2 \times 10^{18}$ cm$^{-3}$ is formed, through the use of the liquid phase epitaxial growth method, to a thickness of about 0.8 μm on a Zn doped p-GaAs substrate 1 having the carrier density of $1 \times 10^{18}$ cm$^{-3}$. A V-shaped groove 3 is formed in the current blocking layer 2 to reach the substrate 1 through the use of an etching method. The V-shaped groove 3 preferably has the width of about 3 through 4 μm, and the V-shaped groove 3 functions as a current path. A plurality of V-shaped grooves 3 are formed in the current blocking layer 2 with the pitch of 300 μm. A Mg doped p-Ga$_{1-x}$Al$_x$As first cladding layer 4 is formed on the current blocking layer 2 to a thickness of about 0.1 μm through 0.2 μm by the liquid phase epitaxial growth method. Then, a Mg doped p-Ga$_{1-y}$Al$_y$As active layer 5 of a thickness of about 0.1 μm is formed on the first cladding layer 4 by the liquid phase epitaxial growth method. Further, a Te doped n-Ga$_{1-x}$Al$_x$As second cladding layer 6 of a thickness of 1 μm is formed on the active layer 5 by the liquid phase epitaxial growth method. Finally, a Te doped n-GaAs cap layer 7 is formed on the second cladding layer 6 to a thickness of about 3 μm by the liquid phase epitaxial growth method. A p-electrode 8 and an n-electrode 9 are secured to the p-GaAs substrate 1 and the n-GaAs cap layer 7, respectively, through the use of the evaporation method. The thus formed wafer is divided in the 300 μm width so that the V-shaped groove 3 is positioned at the center of the width. Further, the cleaved facets are formed at the both ends of the laser device. A multi-layered reflection film 10 is deposited on both the cleaved facets by the evaporation method. The laser oscillation is carried out when the carrier is injected from the p-electrode 8 and the n-electrode 9.

Figure 3:
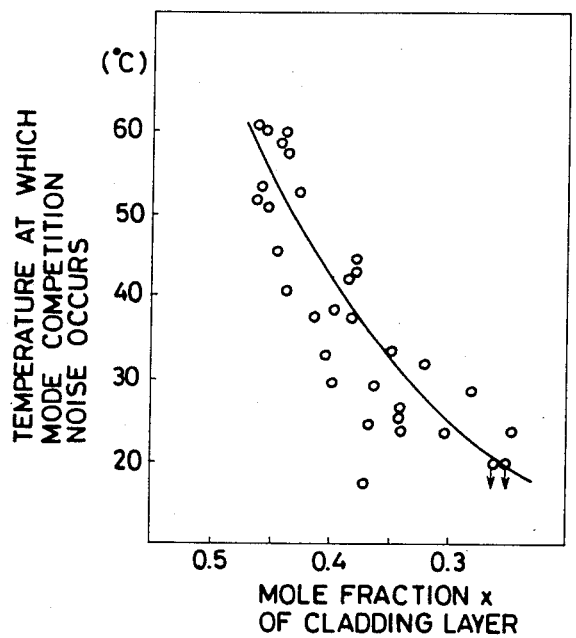
FIG. 3 is a graph showing the temperature at which mode competition noise occurs when the mole fraction of a cladding layer is changed.

FIG. 3 shows the temperature at which the mode competition noise occurs when the AlAs mole fraction x of the first and second cladding layers 4 and 6 is changed. The measurement is carried out when the VSIS semiconductor laser of the construction of FIG. 2 emits the laser beam at 3 mW. The VSIS semiconductor laser used herein has the cavity length of 250 μm, and the cleaved facets on both ends have the same reflectivity $R_1$ and $R_2$ of 0.32. It will be clear from FIG. 3 that the mode competition noise does not occur below 50° C. when the mole fraction x is selected higher than about 0.45. On the other hand, if the mole fraction x of the cladding layers is selected higher than about 0.52, it is difficult to form the index guide by the waveguide mechanism based on the effective refractive index approximation. That is, the gain guide is formed instead of the index guide, and the laser oscillation is carried out in the multiple longitudinal mode. Therefore, the AlAs mole fraction x of the first and second cladding layers should be selected between about 0.45 and 0.52 so as to ensure the single longitudinal mode oscillation without the mode competition noise.

Figure 4:
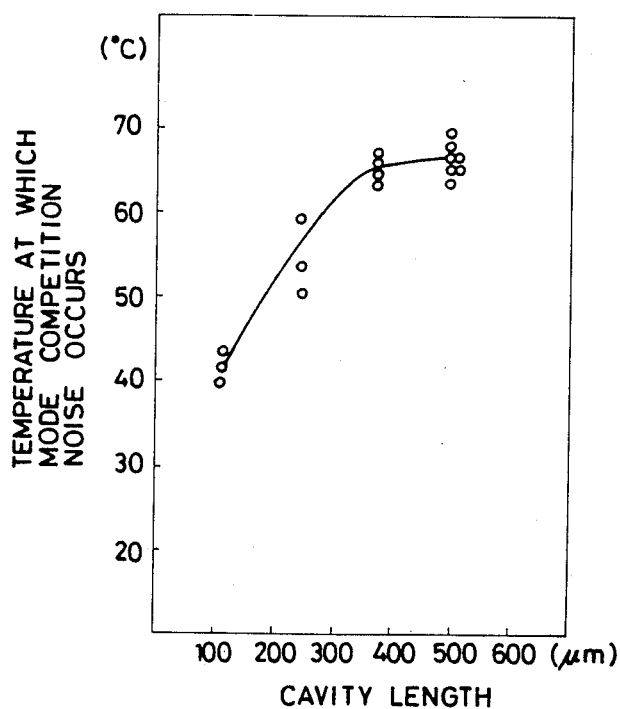
FIG. 4 is a graph showing the temperature at which mode competition noise occurs when the cavity length is changed.

FIG. 4 shows the temperature at which the mode competition noise occurs when the cavity length is changed in the VSIS semiconductor laser of the above-mentioned construction wherein the AlAs mole fraction x of the first and second cladding layers is selected between 0.45 and 0.52. The output power is set at 3 mW, and the cleaved facets on both ends have the same reflectivity $R_1$ and $R_2$ of 0.32. It will be clear from FIG. 4 that the mode competition noise does not occur when the ambient temperature is less than 60° C. if the cavity length is selected longer than about 300 μm even though the normal cavity length of the conventional semiconductor laser is 250 μm through 300 μm.

Figure 5:
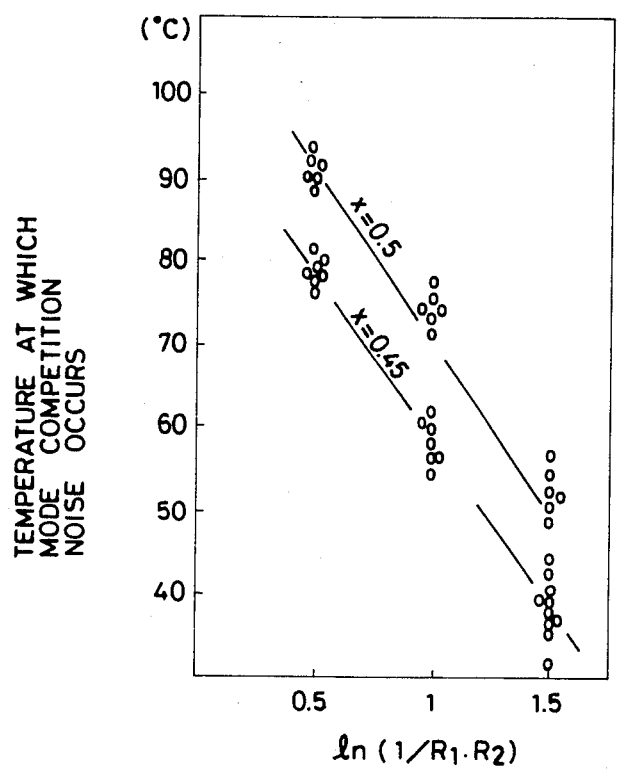
FIG. 5 is a graph showing the temperature at which mode competition noise occurs when the reflectivity of a cleaved facet is changed.

FIG. 5 shows the temperature at which the mode competition noise occurs when the reflectivities $R_1$ and $R_2$ at the cleaved facets are changed while the AlAs mole fraction x of the first and second cladding layers is selected at 0.45 or 0.5. The reflectivity $R_1$ represents the reflectivity on the front facet, and $R_2$ represents the reflectivity at the rear facet. Generally, $R_2$ is greater than or equal to $R_1$. The laser beam output level is 3 mW, and the cavity length is 250 μm. It will be clear from FIG. 5 that the mode competition noise does not occur below 75° C. even in the semiconductor laser of the conventional construction if the reflectivities $R_1$ and $R_2$ are selected to satisfy the following condition.

$$\ln(1/R_1 \cdot R_2) < 1$$

On the other hand, if $\ln(1/R_1 \cdot R_2)$ is less than 0.1, the laser output is not effectively emitted from the front facet. Accordingly, the reflectivities $R_1$ and $R_2$ should be selected to satisfy the following condition.

$$0.1 < \ln(1/R_1 \cdot R_2) < 1$$

The concept of the present invention is applicable to the compound semiconductor laser, such as a GaP laser or a GaAlP laser in addition to the above discussed GaAs-GaAlAs semiconductor laser.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A V-channeled substrate inner stripe (VSIS) semiconductor laser comprising as a composite:
   a p-GaAs substrate;
   an n-GaAs current blocking layer formed on said p-GaAs substrate;
   a V-shaped groove formed in said n-GaAs current blocking layer in a manner to reach said p-GaAs substrate;
   a p-Ga$_{1-x}$Al$_x$As first cladding layer formed on said n-GaAs current blocking layer;
   a p-Ga$_{1-x}$Al$_y$As active layer formed on said p-Ga$_{1-x}$Al$_x$As first cladding layer;
   an n-Ga$_{1-x}$Al$_x$As second cladding layer formed on said p-Ga$_{1-y}$Al$_y$As active layer;
   an n-GaAs cap layer formed on said n-Ga$_{1-x}$Al$_x$As second cladding layer to form said composite and said composite being sandwiched between electrode means, wherein
   said AlAs mole fraction x of the first and second cladding layers is selected between about 0.45 and 0.52 and wherein the cavity length of said V-channeled substrate inner stripe (VSIS) semiconductor laser is selected to be longer than about 300 μm, whereby the occurrence of the mode competition noise at the normal operating temperature is minimized.

2. The V-channeled substrate inner stripe (VSIS) semiconductor laser of claim 1 wherein said V-channeled substrate inner stripe (VSIS) semiconductor laser has a front facet with a reflectivity $R_1$ and a rear facet with a reflectivity $R_2$, said reflectivities $R_1$ and $R_2$ satisfying the following condition:

$$0.1 \leq \ln(1/R_1 \cdot R_2) \leq 1.$$

3. An index guided semiconductor laser having the inner stripe structure comprising, as a composite,
   a substrate,
   a current blocking layer formed on said substrate,
   a V-shaped groove formed in said current blocking layer in a manner to reach said substrate,
   a p-$Ga_{1-x}Al_xAs$ first cladding layer formed on said current blocking layer,
   an active layer formed on said first cladding layer,
   a n-$Ga_{1-x}Al_xAs$ second cladding layer containing Al and As formed on said active layer,
   a cap layer formed on said second cladding layer to form said composite, and said composite being sandwiched between electrode means, wherein said AlAs mole fraction x of the first and second cladding layers is selected between about 0.45 and 0.52, wherein the cavity length of said V-channeled substrate inner stripe (VSIS) semiconductor laser is selected to be longer than about 300 μm, whereby the occurrence of the mode competition noise at the normal operating temperature is minimized and wherein said semiconductor laser have a front facet and rear facet of which the reflectivities $R_1$ and $R_2$, respectively, satisfy the following condition:

$$0.1 \leq \ln(1/R_1 \cdot R_2) < 1.$$

* * * * *